United States Patent
Maruyama

(10) Patent No.: US 7,642,551 B2
(45) Date of Patent: Jan. 5, 2010

(54) WAFER-LEVEL PACKAGE HAVING TEST TERMINAL

(75) Inventor: Shigeyuki Maruyama, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 12 days.

(21) Appl. No.: 12/155,783

(22) Filed: Jun. 10, 2008

(65) Prior Publication Data

US 2008/0251788 A1  Oct. 16, 2008

Related U.S. Application Data

(62) Division of application No. 11/433,396, filed on May 15, 2006, now Pat. No. 7,399,990, which is a division of application No. 10/843,301, filed on May 12, 2004, now Pat. No. 7,071,487, which is a division of application No. 09/803,013, filed on Mar. 12, 2001, now Pat. No. 6,762,431, which is a division of application No. 09/472,824, filed on Dec. 28, 1999, now Pat. No. 6,228,684.

(30) Foreign Application Priority Data

Dec. 28, 1998 (JP) .................. 10-374804

(51) Int. Cl.
- H01L 23/48 (2006.01)
- H01L 23/58 (2006.01)
- H01L 23/34 (2006.01)
- H01L 27/04 (2006.01)
- H01L 23/12 (2006.01)
- G01R 31/02 (2006.01)
- G01R 31/26 (2006.01)

(52) U.S. Cl. .......... 257/48; 257/E23.179; 257/E23.012; 257/E21.523; 257/E23.01; 257/620; 257/690; 257/203; 257/207; 257/211; 257/208; 257/723; 257/685; 257/698; 257/696; 257/784; 257/786; 257/777; 257/724; 257/691; 324/537; 324/765; 324/73.1; 324/754; 324/763

(58) Field of Classification Search .................. 257/48, 257/E23.012, E21.523, E23.179, 786, 620, 257/E23.01, 690, 203, 207, 211, 208, 777, 257/724, 723, 685, 696, 784, 691; 324/537, 324/73.1, 765, 754, 158 R, 763
See application file for complete search history.

(56) References Cited

U.S. PATENT DOCUMENTS

| | | |
|---|---|---|
| 4,961,053 A | 10/1990 | Krug |
| 5,059,899 A | 10/1991 | Farnworth et al. |
| 5,323,051 A | 6/1994 | Adams et al. |
| 5,342,999 A | 8/1994 | Frei et al. |
| 5,366,906 A | 11/1994 | Wojnarowski et al. |
| 5,489,538 A | 2/1996 | Rostoker et al. |
| 5,532,174 A | 7/1996 | Corrigan |
| 5,535,101 A | 7/1996 | Miles et al. |
| 5,654,588 A | 8/1997 | Dasse et al. |
| 5,696,404 A | 12/1997 | Murari et al. |
| 5,808,947 A | 9/1998 | McClure |
| 5,838,163 A | 11/1998 | Rostoker et al. |
| 5,858,815 A | 1/1999 | Heo et al. |
| 5,956,567 A | 9/1999 | Tomita |
| 6,008,523 A | 12/1999 | Narayan et al. |
| 6,043,109 A | 3/2000 | Yang et al. |
| 6,121,065 A * | 9/2000 | Wong et al. .................. 438/17 |
| 6,127,729 A | 10/2000 | Fukuda |
| 6,204,074 B1 | 3/2001 | Bertolet et al. |
| 6,358,833 B1 | 3/2002 | Akram et al. |
| 6,396,300 B1 | 5/2002 | Loughmiller et al. |
| 6,410,936 B1 | 6/2002 | Hongo |
| 6,427,222 B1 | 7/2002 | Shau |
| 6,429,675 B2 | 8/2002 | Bell |
| 6,436,802 B1 | 8/2002 | Khoury |
| 6,563,330 B1 | 5/2003 | Maruyama et al. |
| 6,744,067 B1 | 6/2004 | Farnworth et al. |

| | | | |
|---|---|---|---|
| 2001/0024118 A1 | 9/2001 | Farnworth et al. | |
| 2002/0158326 A1 | 10/2002 | Furuya et al. | |

FOREIGN PATENT DOCUMENTS

| | | |
|---|---|---|
| CN | 1249534 A | 4/2000 |
| EP | 0 405 586 | 1/1991 |
| EP | 0 810 659 | 12/1997 |
| JP | 59-52860 | 3/1984 |
| JP | 62-219942 A | 9/1987 |
| JP | 01-215040 A | 8/1989 |
| JP | 02-003948 A | 1/1990 |
| JP | 03-266446 A | 11/1991 |
| JP | 06-005677 A | 1/1994 |
| JP | 6-69298 | 3/1994 |
| JP | 7-263508 | 10/1995 |
| JP | 8-227921 | 9/1996 |
| JP | 9-55411 | 2/1997 |

OTHER PUBLICATIONS

Office Action dated Jan. 30, 2007, issued in corresponding Japanese Application No. 10-374804.

* cited by examiner

*Primary Examiner*—Alexander O Williams
(74) *Attorney, Agent, or Firm*—Westerman, Hattori, Daniels & Adrian, LLP

(57) ABSTRACT

A wafer-level package includes a semiconductor wafer having at least one semiconductor chip circuit forming region each including a semiconductor chip circuit each provided with test chip terminals and non test chip terminals, at least one external connection terminal, at least one redistribution trace provided on the semiconductor wafer, at least one testing member, and an insulating material. A first end of the redistribution trace is connected to one of the test chip terminals and a second end of said redistribution trace is extended out to a position offset from the chip terminals. The testing member is provided in an outer region of the semiconductor chip circuit forming region, and the second end of the redistribution trace is connected to the testing member.

1 Claim, 12 Drawing Sheets

WAFER-LEVEL PACKAGE HAVING TEST TERMINAL

This Application is a Divisional application of application Ser. No. 11/433,396, filed May 15, 2006, now U.S. Pat. No. 7,399,990 which is a divisional application of Ser. No. 10/843,301 filed May 12, 2004, now U.S. Pat. No. 7,071,487 which is a divisional application of prior application Ser. No. 09/803,013, filed Mar. 12, 2001, now U.S. Pat. No. 6,762,431 B2, which is a divisional application of Ser. No. 09/472,824 filed on Dec. 28, 1999, now U.S. Pat. No. 6,228,684.

BACKGROUND OF THE INVENTION

1. Field of the Invention

The present invention generally relates to a wafer-level package, a method of manufacturing thereof, and a method of manufacturing semiconductor devices from such a wafer-level package. The present invention particularly relates to an improved wafer-level package to be tested by a preliminary test (PT) and a final test (FT), a method of manufacturing the wafer-level package, and a method of manufacturing semiconductor devices using such a wafer-level package.

Recently, there is a need for more efficient manufacturing and testing processes of semiconductor devices. In order to achieve this, a full test (including PT and FT) is implemented on an uncut semiconductor wafer before being cut into individual semiconductor devices and each of the semiconductor devices are tested individually.

The advantages include good handling efficiency, a possibility of sharing certain equipment and reduced space. If the wafer sizes are equal, handling equipment can be shared. Also, it is possible to save space otherwise taken up as a storage area and/or an installation area when accommodating individualized semiconductor devices (LSI chips) in containers such as a tray.

For higher density mounting, there is an increasing need for a KGD (Known-Good Die) and a real-chip-size package (a package having the same size as that of the semiconductor chip). However, with the package structure of the semiconductor device of the related art, which does not correspond to the KGD or the real-chip-size package, the area of the package is greater than that of the semiconductor chip. Therefore, the semiconductor wafer must be individualized at some point before packaging. Thus, with the package structure of the related art, the entire process, that is to say, from a manufacture process to a test process, cannot be implemented on the semiconductor wafer.

However, with the KGD or the real-chip-size package, since the final package configuration corresponds to the area of the semiconductor chip, the entire process can be implemented on the semiconductor wafer. Therefore, the above-described advantages can be obtained.

2. Description of the Related Art

Recently, there is an increasing interest in a wafer-level package which is a package structure with which the entire process from the manufacturing process to the testing process can be implemented on a semiconductor wafer. The wafer-level package includes a semiconductor wafer provided with a plurality of semiconductor chip circuits with chip terminals, external connection terminals, redistribution traces connecting the chip terminals and the external connection terminals, and an insulating material such as a sealing resin. The insulating material is provided for protecting the semiconductor chip circuits and the redistribution traces. A structure without the insulating material is also possible.

The wafer-level package may be used in two different configurations. One is in the form of a wafer (i.e., before being cut) and the other is in form of individual semiconductor devices (i.e., after cutting into individual semiconductor chip circuits.)

In the following, the wafer-level package of the above-described structure will be described with regard to a test process thereof. With the wafer-level package, like that of the semiconductor devices of other configurations, the manufacture process includes a test process. The test process generally includes a preliminary test (PT) and a final test (FT).

The PT is a test implemented before providing the insulating material. The PT is a general test such as a conduction test of the interconnections, and thus does not include the operation test of the semiconductor chip circuit itself. Since the PT is implemented before providing the insulating material, the PT can be implemented using the chip terminals provided on the semiconductor chip circuit.

The PT is particularly advantageous for the package structure of the semiconductor devices of the related art (hereinafter, referred to as a conventional package), which are not designed for the KGD or for the real-chip-size package. In a manufacture process of the conventional package, the PT is followed by a cutting process (i.e., dicing process) for individualizing the semiconductor wafer into the semiconductor devices. Then, only those semiconductor devices, which were determined good in the PT, are provided with the insulating material and undergo the FT. In other words, those semiconductor devices, which were determined bad in the PT, are not provided with the insulating material and also do not undergo the FT. Thus, the manufacture efficiency can be improved.

The FT is implemented after providing the insulating material. The FT is a total test including the operation test of the semiconductor chip circuit. Since the FT is implemented after the insulating material has been provided, the FT can only be implemented using the external connection terminals exposed from the insulating material. In other words, the terminals (such as the chip terminals) other than those generally used by the users are not exposed. Therefore, the chip terminals sealed in the insulating material cannot be used in the FT.

Therefore, in the related art, the wafer level package is tested by, first, implementing the PT before providing the insulating material using the chip terminals which are not yet covered with the insulating material. After the PT, the insulating material is provided, and then the FT is implemented using the external connection terminals exposed from the insulating material.

In the test process of the related art, the object of implementing the PT is to improve manufacture efficiency by avoiding the insulating material being provided on bad semiconductor devices and thus avoiding the FT being implemented thereon. On the contrary, with the wafer-level package, all semiconductor chip circuits, including circuits of the bad semiconductor devices, are provided with the insulating material and undergo the FT, so that it is not necessary to implement the PT before the FT.

Also, as has been described above, the wafer-level package is used for simplifying the manufacture process by using the semiconductor wafer from the manufacture process to the test process. For further simplifying the manufacture process, the PT and the FT, which in the related art were implemented as two separate tests, can be integrated into a single test process.

When the PT and the FT are integrated into a single test process, the integrated test process can be carried out either before providing the insulating material (i.e., when the PT is implemented in the related art) or after providing the insulating material (i.e., when the FT is implemented in the related art). When the integrated test process is implemented before providing the insulating material, it is not possible to detect any failure produced in the semiconductor chip circuit while providing the insulating material. Thus, the test process should be implemented in a later step in the manufacture process of the semiconductor device.

On the contrary, when the integrated test process is implemented after providing the insulating material, only the external connection terminals exposed from the insulating material may be connected to test equipment (e.g., a semiconductor tester). That is to say, the chip terminals include terminals which do not serve as the external connection terminals but can be used for testing the semiconductor chip circuit (hereinafter referred to as test chip terminals). There is a drawback that the test chip terminals will be covered with the insulating material, so that the test using the test chip terminals cannot be implemented after providing the insulating material.

In order to avoid such a drawback, test terminals may be provided in a region of the semiconductor chip circuit region, which terminals are exposed from the insulating material and are connected to the above-described test chip terminals. Thus, with such test terminals, all tests including the PT and the FT (full test) can be implemented after providing the insulating material.

However, the test terminals will not be used after the test process, and thus become unwanted terminals for the package. Such test terminals provided on the semiconductor chip circuit forming region results in an increase in the size of the semiconductor chip circuit forming region due to an area occupied by the test terminals. Accordingly, it is not possible meet the requirement for a miniaturization of the semiconductor device.

Also, when the test terminals are provided at a position adjacent to the external connection terminals used for operating the semiconductor chip, the test terminals may also be mistakenly mounted on a mounting board. In such a case, a false operation may occur. Therefore, the test terminals should not remain on the package after the insulating material has been provided.

Further, the PT can be omitted (that is to say, all tests can be implemented in the FT), but as has been described above, not all test chip terminals can be used in the FT. Therefore, tests, which used to be implemented in the PT only, cannot be implemented. For example, if the RAM and logic circuits are mounted in a mixed manner, a single test of the RAM cannot be carried out. At the same time, recently, since a high reliability is required for the semiconductor device, the PT cannot be omitted just for the sake of simplifying the manufacturing process.

From the above-described reasons, the PT and the FT have not been integrated in the related art. First, the PT is implemented, and then the insulating material is provided. Finally, the FT is implemented. Therefore, there is a problem that the manufacture process of the wafer-level package is complicated and thus the manufacture efficiency is decreased and the manufacture cost is increased.

SUMMARY OF THE INVENTION

Accordingly, it is a general object of the present invention to provide a wafer-level package, a method of manufacturing thereof, and a method of manufacturing a semiconductor device from such a wafer-level package which can solve the problems described above.

It is another and more specific object of the present invention to provide a wafer-level package, a method of manufacturing thereof, and a method of manufacturing a semiconductor device from such a wafer-level package which can improve a manufacturing efficiency and reduce a manufacturing cost.

In order to achieve the above objects according to the present invention, a wafer-level package includes:

a semiconductor wafer having at least one semiconductor chip circuit forming region each including a semiconductor chip circuit and a plurality of chip terminals, the chip terminals including at least one test chip terminal and at least one non-test chip terminal;

at least one external connection terminal electrically connected to the at least one non-test chip terminal;

at least one redistribution trace provided on the semiconductor wafer, a first end of the redistribution trace being connected to one of the test chip terminals and a second end of the redistribution trace being extended out to a position offset from the one of the chip terminals;

at least one testing member provided in an outer region of the semiconductor chip circuit forming region, the second end of the redistribution trace being connected to the least one testing member; and an insulating material covering at least the redistribution trace, the at least one external connection terminal and the at least one testing member being exposed from the insulating material.

With the wafer-level package described above, even when the testing member is provided, the semiconductor chip circuit forming region will not become large. Therefore, the size of each individualized semiconductor device will be small compared to that of the structure in which the testing member is provided in the semiconductor chip circuit forming region.

Also, the testing member is provided in the outer region of the semiconductor chip circuit forming region, which outer region is to be removed upon individualizing into semiconductor devices. Therefore, even if the testing member is provided on the wafer-level package, the operating condition of the individualized semiconductor device will not be altered.

In order to achieve the above object, a wafer-level semiconductor device is disclosed, which includes:

a semiconductor wafer having chip circuit forming regions;

at least one testing member provided in an outer region of the chip circuit forming regions; and a line provided on the semiconductor wafer and connecting the at least one testing member and a test terminal provided in one of the chip circuit forming regions.

It is still another object of the present invention to provide an easier method of manufacturing the above-described wafer-level package.

In order to achieve the above object, a method of manufacturing a wafer-level package includes the steps of:

a) preparing a semiconductor wafer having at least one semiconductor chip circuit forming region each provided with a semiconductor chip circuit and a plurality of chip terminals, at least one of the chip terminals being a test chip terminal and at least one being a non-test chip terminal;

b) providing a redistribution layer including an insulating film having through holes on the semiconductor wafer and an electrically conductive film formed on the insulating film, the film being formed into redistribution traces having a predetermined pattern;

c) providing external connection terminals and at least one testing member on the redistribution layer, the at least one testing member being provided at an outer region of the at least one semiconductor chip circuit forming region and connected to the test chip terminal via at least one of the redistribution traces;

d) testing the at least one semiconductor chip circuit using the at least one-testing member; and e) providing a sealing resin on the redistribution layer in such a manner that top parts of the external connection terminals and the at least one testing member are exposed from the sealing resin.

With the above-described method, the external connection terminals and the testing members can be provided simultaneously. Further, the PT and the FT can be implemented simultaneously. Thus, the package manufacturing process and the test process can be simplified.

It is yet another object of the present invention to provide an easier method of manufacturing at least one semiconductor device using the above-described wafer-level package.

In order to achieve the above-described object, a semiconductor device manufacturing method includes the steps of:

a) manufacturing the wafer-level package as described above, b) testing the at least one semiconductor chip circuit provided in the at least one semiconductor chip circuit forming region by means of said at least one testing member; and c) after the step b), cutting the wafer-level package along the outer region so as to manufacture at least one individualized semiconductor devices.

With the above-described method, external connection terminals and the testing member can be provided simultaneously. Further, the PT and the FT can be implemented simultaneously. Thus, the package manufacturing process and the test process can be simplified.

Also, the testing member will be removed when individualizing the semiconductor devices, so that the operating condition of the individualized semiconductor device will not be altered.

It is yet another object of the present invention to provide a semiconductor device which can be manufactured according to a method of the present invention.

In order to achieve the above object, a semiconductor device includes:

a semiconductor chip;

a test terminal and a non-test terminal provided to the semiconductor chip; and a line which is connected to the test terminal and extends out of a circuit forming region.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 1:
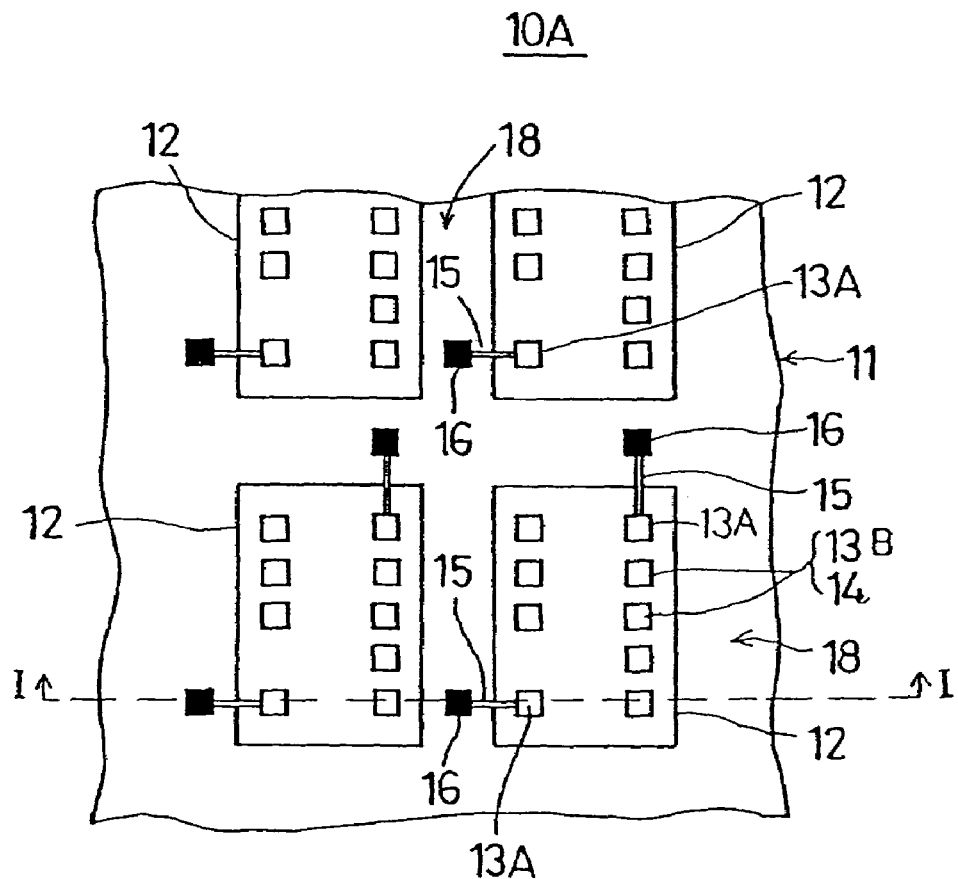
FIG. 1 is a diagram showing a connection state of a wafer-level package of a first embodiment of the present invention.
Figure 2:
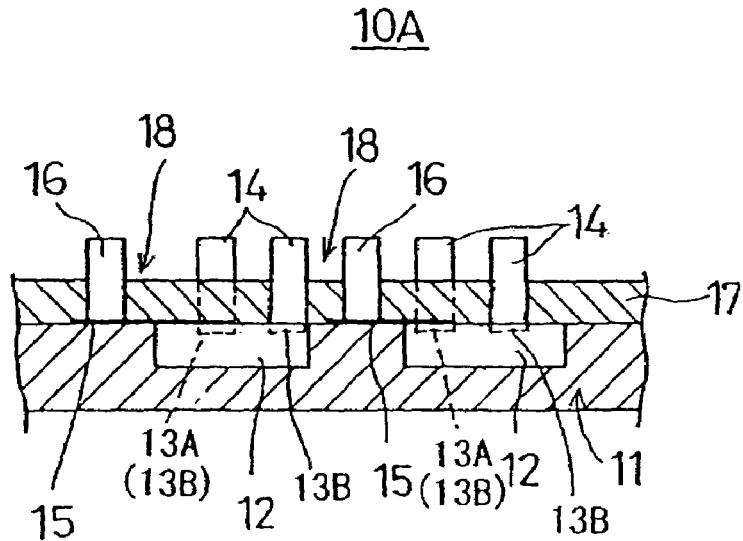
FIG. 2 is a partial sectional view showing the wafer-level package of the first embodiment of the present invention taken along a broken line I-I.
Figure 3:
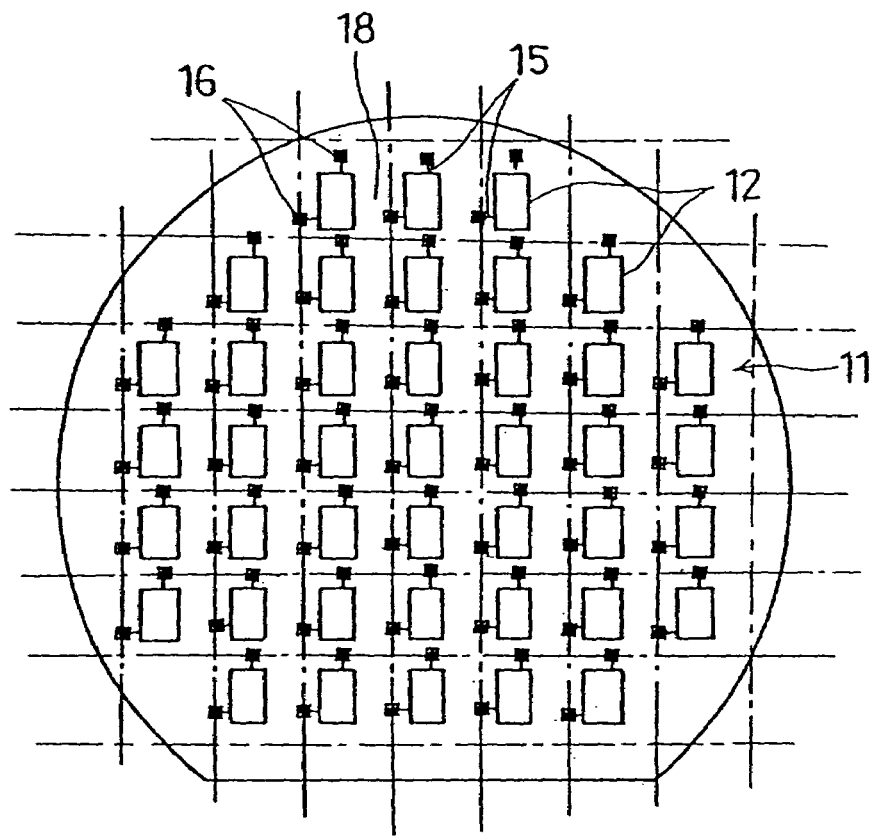
FIG. 3 is a plan view showing the wafer-level package of the first embodiment of the present invention.

FIGS. 1 to 3 are diagrams showing a wafer-level package 10A of a first embodiment of the present invention. FIG. 1 is a diagram showing a connection state of the wafer-level package 10A, FIG. 2 is a diagram showing a connection state of the wafer-level package 10A, and FIG. 3 is a diagram showing a connection state of the wafer-level package 10A.

The wafer-level package 10A may be used as an uncut wafer or may be cut into individualized semiconductor devices 40 (shown in FIG. 19) having respective semiconductor chip circuits.

As shown in FIG. 2, the wafer-level package 10A includes a semiconductor wafer 11 provided with external connection terminals 14, redistribution traces 15, test terminals 16, and an insulating layer 17 (insulating material).

The semiconductor wafer 11 is, for example, a silicon substrate provided with a plurality of semiconductor chip circuit forming regions 12 (hereinafter referred to as circuit regions). The circuit region 12 is provided with a semiconductor chip circuit and a plurality of chip terminals 13 formed thereon. The chip terminals 13 are connected to the semiconductor chip circuits. Thus, the semiconductor chip circuit will operate when signals and electrical power are supplied to the chip terminals 13.

Also, the plurality of chip terminals 13 may be categorized into two groups according to their functions. A first group includes chip terminals directly contributing to the operation of the semiconductor chip circuit, and the other group includes chip terminals used only for testing the semiconductor chip circuit. In the following description, the chip terminals in the latter group (i.e., chip terminals used for testing the semiconductor chip circuit) will be referred to as test chip terminals 13A. The chip terminals other than the test chip terminals 13A will be referred to as non-test chip terminals 13B.

The external connection terminals 14 are terminals used for mounting the wafer-level package 10A or the individualized semiconductor devices 40 on a mounting board (not shown). In the present embodiment, the external connection terminals 14 are directly provided on the non-test chip terminals 13B and are not provided on the test chip terminals 13A. Therefore, in the present embodiment, the external connection terminals 14 are provided at positions corresponding to the non-test chip terminals 13B. The external connection terminals 14 are provided so as to protrude by a predetermined amount from the upper surface of the semiconductor wafer 11. The external connection terminals 14 may be provided by techniques such as sputtering, deposition and metal plating.

The redistribution traces 15 are made of an electrically conductive layer and are formed into a predetermined pattern on the upper surface of the semiconductor wafer 11. One end of the redistribution trace 15 is connected to the chip terminal 13 (13A), while the other end of the redistribution trace 15 is connected to the test terminal 16. In the cross-sectional diagram, the redistribution trace 15 seem to extend to the external connection terminal 14, however, as can be seen in FIG. 1, in fact, the external connection terminal 14 is not connected to the redistribution trace 15. Thus, by providing the redistribution traces 15 on the semiconductor wafer 11, the chip terminals 13 can be extended to desired positions on the semiconductor wafer 11. Then, the external connection terminals 14 or the test terminals 16 can be formed at the desired positions.

Thus, by providing the redistribution traces 15, there is greater freedom in the layout of the terminals. That is to say, with the redistribution traces 15, the respective terminals 13 can be pulled out to positions not only within the circuit region 12 but also outside the circuit region 12. Hereinafter, the region outside the circuit region 12 is referred to as an outer region 18.

In the present embodiment, as has been described above, the external connection terminals 14 are directly formed on the non-test chip terminals 13B. Therefore, the redistribution traces 15 extend only from the test chip terminals 13A. Also, though not shown, an insulating film is provided on the upper part of the circuit region 12, and the redistribution trace 15 is formed on the insulating film. Therefore, even if the redistribution traces 15 are formed on the circuit region 12, the redistribution traces 15 and the semiconductor chip circuit will not be short-circuited.

The test terminals 16 are used for testing the semiconductor chip circuit formed in the circuit region 12. The test terminals 16 are provided so as to protrude by a predetermined amount from the upper surface of the semiconductor wafer 11. In a similar matter to the external connection terminals 14, the test terminals 16 may be provided by techniques such as sputtering, deposition and metal plating.

Also, as shown in FIG. 2, the test terminals 16 are configured such that the height of the protrusions and shapes thereof are equal to those of the external connection terminals 14. The test terminals 16 are, via the above-described redistribution traces 15, connected to the test chip terminals 13A provided in the circuit region 12. Therefore, the test terminals 16 are terminals only used for testing the wafer-level package 10A.

The insulating layer 17 is made of an insulating material, e.g., $SiO_2$, having a predetermined thickness. The insulating layer 17 protects the semiconductor chip circuit provided in the circuit region 12, the chip terminals 13, and the redistribution traces 15. In the present embodiment, the insulating layer 17 is provided on the entire surface of the semiconductor wafer 11, with the above-described external connection terminals 14 and the test terminals 16 being exposed (or protruded) from the insulating layer 17.

Therefore, even after providing the insulating layer 17 on the semiconductor wafer 11, an electrical conduction with the semiconductor chip circuit can be achieved by means of the external connection terminals 14 and the test terminals 16.

Now, the position of the test terminals 16 of the wafer-level package 10A of the above-described structure will be described. As has been described above, the test terminals 16 are connected to the test chip terminals 13A via the redistribution traces 15. Also, the redistribution traces 15 can be extended to positions not only within the circuit region 12 but also to the outer region 18.

The present embodiment is characterized in that the redistribution traces 15 are extended out of the circuit region 12 to the outer region 18, and the test terminals 16 are provided in the outer region 18. Also, when the wafer-level package 10A is used as individualized semiconductor devices 40, a cutting (scribing) process is implemented on the wafer-level package 10A. The test terminals 16 are provided on the positions to be scribed (i.e., scribe regions). In FIG. 3, the scribe regions are indicated by dash-dot lines.

With the wafer-level package 10A of the present embodiment, each of the test chip terminals 13A is extended out of the circuit region 12 to the outer region 18 by means of the redistribution trace 15. Then, at an end extended out in the outer region 18, the redistribution trace 15 is provided with the test terminal 16 exposed from the insulating layer 17. Thus, the test terminals 16 can be used even after the insulating layer 17 has been provided.

Thus, since the test can be implemented using both the external connection terminals 14 and the test terminals 16, the PT, which was implemented before providing the insulating layer 17, and the FT, which was implemented after providing the insulating layer 17, can now be implemented simultaneously. Accordingly, with a simultaneous full test, the test process (manufacture process) can be simplified and the manufacturing cost can be reduced.

Also, by providing the redistribution traces 15, the test terminals 16 are provided in the outer region 18 (outside the circuit region 12). Thus, the area of the circuit region 12 will not increase even if the test terminals 16 are provided. Therefore, the size of the individualized semiconductor device 40 can be reduced.

Further, the outer region 18, in which the test terminals 16 are provided, is a region to be removed upon individualizing the wafer-level package 10A into the semiconductor devices 40. Therefore, when the semiconductor devices 40 are individualized, the test terminals 16 will be removed together with the outer region 18, and will not remain on the semiconductor device 40. Therefore, even if the test terminals 16 are provided on the wafer-level package 10A, the operating condition of the individualized semiconductor device 40 will not be altered.

Also, in the above-described embodiment, the test terminals 16 are provided in the scribe regions (see FIG. 3). However, the test terminals 16 can be provided at positions not only within the scribe regions, but also in other regions in the outer region 18 other than the scribe regions (e.g., peripheral positions of the semiconductor wafer 11).

In the following, a second embodiment of the present embodiment will be described.

Figure 4:
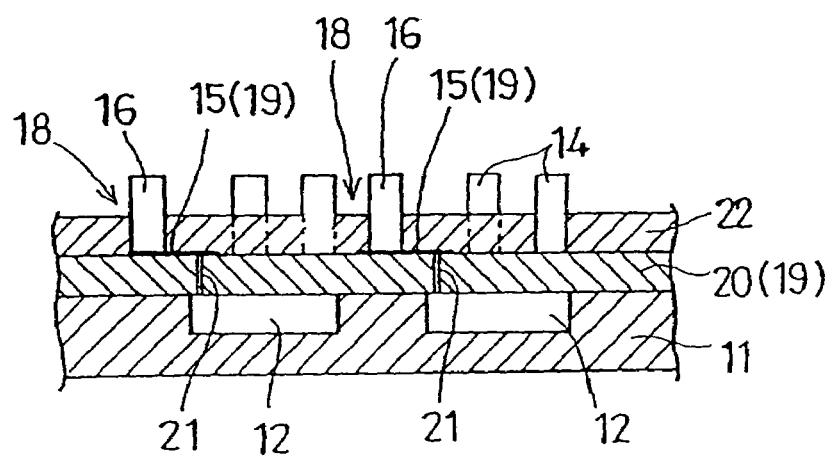
FIG. 4 is a partial sectional view showing a wafer-level package of a second embodiment of the present invention.

FIG. 4 is a partial sectional view showing a wafer-level package 10B of a second embodiment of the present invention. In FIG. 4, components which are the same as those of the wafer-level package 10A of the first embodiment illustrated in FIGS. 1 to 3 are indicated with the same reference numbers, and detailed explanations thereof are omitted. This also applies to each of the embodiments described with reference to FIGS. 5 to 20.

In the wafer-level package 10B of the second embodiment, the semiconductor wafer 11 is provided with a redistribution layer 19. The redistribution layer 19 is provided with the external connection terminals 14, the test terminals 16 and a sealing resin 22 (insulating material).

The redistribution layer 19 includes the redistribution traces 15, an insulating film 20, and through holes 21. The insulating film 20 is made of an insulating material, e.g., $SiO_2$, and is provided with the redistribution traces 15 having a predetermined pattern. Also, the insulating film 20 is provided with the through holes 21. The chip terminals 13 provided in the circuit region 12 and the redistribution traces 15 are electrically connected by means of the through holes 21.

The sealing resin 22 may be an epoxy-type resin, and can be provided on the entire surface of the semiconductor wafer 11, for example, by molding. Also, the above-described external connection terminals 14 and the test terminals 16 penetrate through this sealing resin 22 and protrude upwards, so as to enable an electrical connection with an external part. Also, the external connection terminals 14 are connected to the chip terminals 13 provided in the circuit region 12 by means of through holes 21, but such structure is not shown in the figure for the sake of clarity.

The wafer-level package 10B of the above structure may also achieve the same effect as that of the wafer-level package 10A of the first embodiment. Further, in the present embodiment, the sealing resin 22 is made of an epoxy-type resin, which is commonly used as the resin package material. Therefore, the semiconductor wafer 11 (the semiconductor chip circuit, the redistribution traces 15, etc) is securely protected, thus improving the reliability of the wafer-level package 10B. Also, the sealing resin 22 need not be made of the epoxy-type resin, but can also be made of other resin such as polyimide.

In the following, a third embodiment of the present invention will be described.

Figure 5:
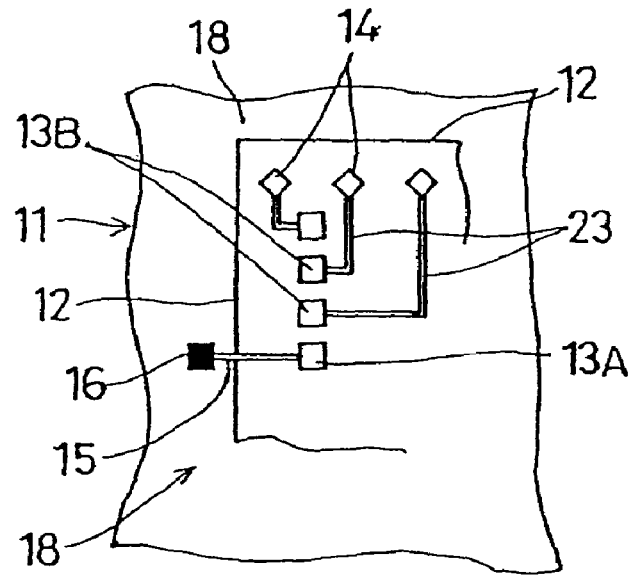
FIG. 5 is a diagram showing a connection state of a wafer-level package of a third embodiment of the present invention.

FIG. 5 is a diagram showing a connection state of a wafer-level package 10C of a third embodiment of the present invention. The wafer-level package 10A of the first embodiment described with reference to FIGS. 1 to 3 relates to a structure in which the external connection terminals 14 are formed directly on the non-test chip terminals 13B. On the contrary, the present embodiment is characterized in that it is provided with internal redistribution traces 23 inside the circuit region 12, so that the non-test chip terminals 13B and the external connection terminals 14 are provided at mutually offset positions.

Thus, the positions of the external connection terminals 14 do not necessarily correspond with the positions of the non-test chip terminals 13B. Also, because the non-test chip terminals 13B and the external connection terminals 14 are provided at mutually offset positions, the circuit structure of the semiconductor chip circuit within the circuit region 12 can be designed with greater freedom.

In the following, a fourth embodiment of the present invention will be described.

Figure 6:
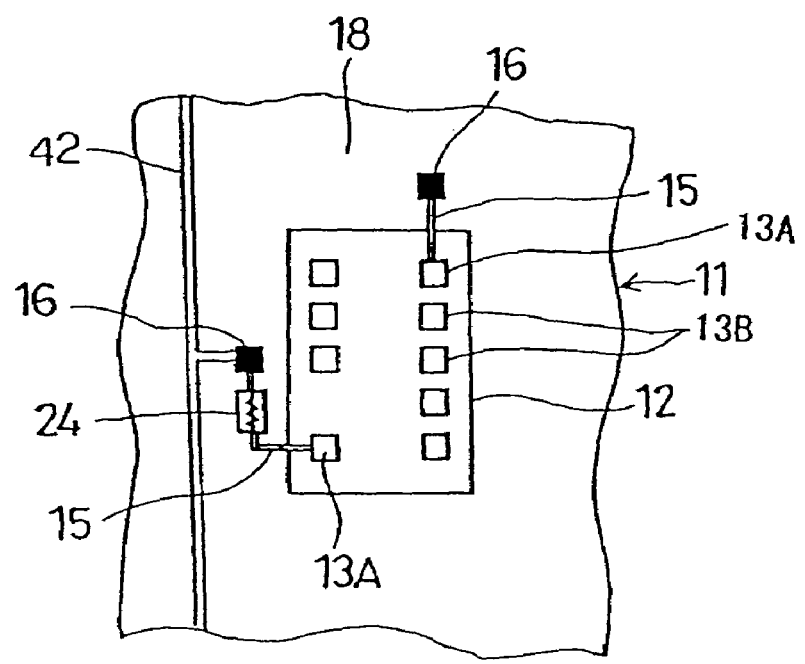
FIG. 6 is a diagram showing a connection state of a wafer-level package of a fourth embodiment of the present invention.

FIG. 6 is a diagram showing a connection state of a wafer-level package 10D of a fourth embodiment of the present invention. The wafer-level package 10D of the present embodiment is characterized in that a fuse 24 is provided at an intermediate position of one of the redistribution traces 15 extends out to the outer region 18. The fuse 24 prevents an excessive power supply between the test chip terminal 13A and the test terminal 16. One of the test chip terminals 13A is a power supply terminal and the test terminals 16 are connected to a power supply line 42.

For example, when implementing a burn-in test on a wafer-level package, it is often difficult to provide a power supply line independently to each semiconductor chip circuit. As in the present embodiment, by sharing the power supply line 42 between the plurality of semiconductor chip circuits, the burn-in test can be implemented at a reduced cost.

However, when sharing the power supply line 42 between the plurality of semiconductor chip circuits, if a semiconductor chip circuit has bad DC characteristics (power supply short circuit), there is a risk of burning other semiconductor chip circuits. By providing the fuse 24, even if an excessive power supply occurs due to the presence of a bad semiconductor chip circuit, the fuse 24 will break so that other normal semiconductor chip circuits will be prevented from being damaged.

Further, the fuse 24 will not remain on the semiconductor device 40 since the fuse 24 is provided in the outer region 18, and thus is removed when individualizing into semiconductor devices 40. Therefore, even if the fuse 24 is provided, the operating condition of the individualized semiconductor device 40 will not be altered.

In the following, a fifth embodiment of the present invention will be described.

Figure 7:
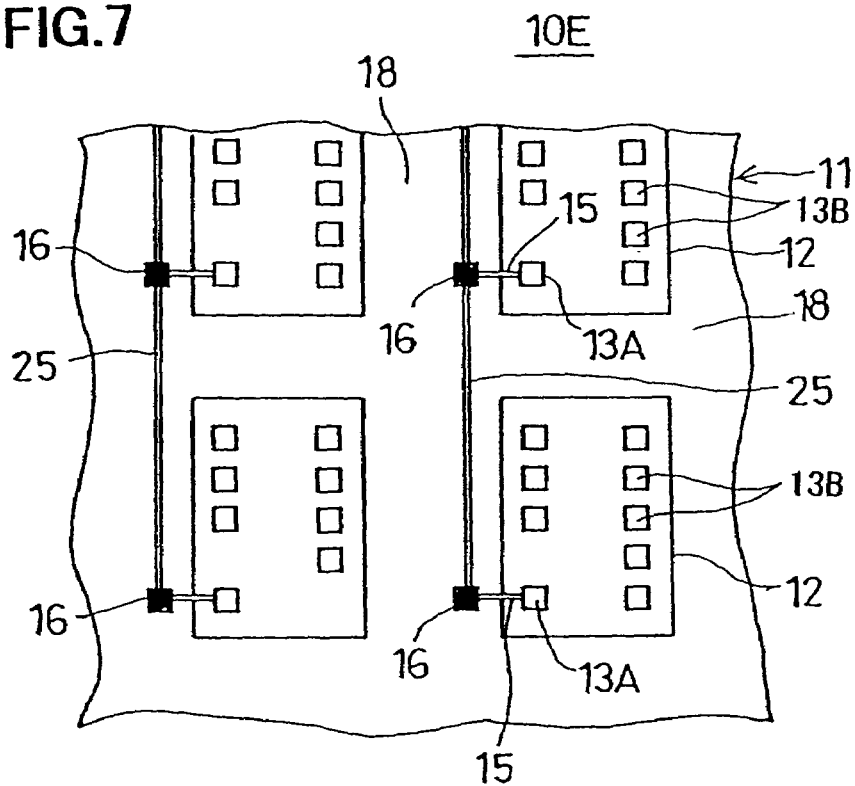
FIG. 7 is a diagram showing a connection state of a wafer-level package of a fifth embodiment of the present invention.

FIG. 7 is a diagram showing a connection state of a wafer-level package 10E of a fifth embodiment of the present invention. The wafer-level package 10E of the present embodiment is characterized in that the test terminals 16 provided for respective ones of the plurality of circuit regions 12 are connected by a common line 25 formed in the external area 18.

With this structure, by supplying test signals to one of the test terminals 16, the test signals can be simultaneously supplied to the plurality of test terminals 16 via the common line 25. Therefore, a number of interconnections can be reduced. Also, test efficiency is improved compared to a structure in which respective signals are provided to each one of the test terminals 16.

Also, the common line 25 is provided in the outer region 18, and thus is removed when individualizing into semiconductor devices 40. Therefore, even if the common line 25 is provided on the wafer-level package 10E, the operating condition of the individualized semiconductor device 40 will not be altered.

In the following, a sixth embodiment of the present invention will be described.

Figure 8:
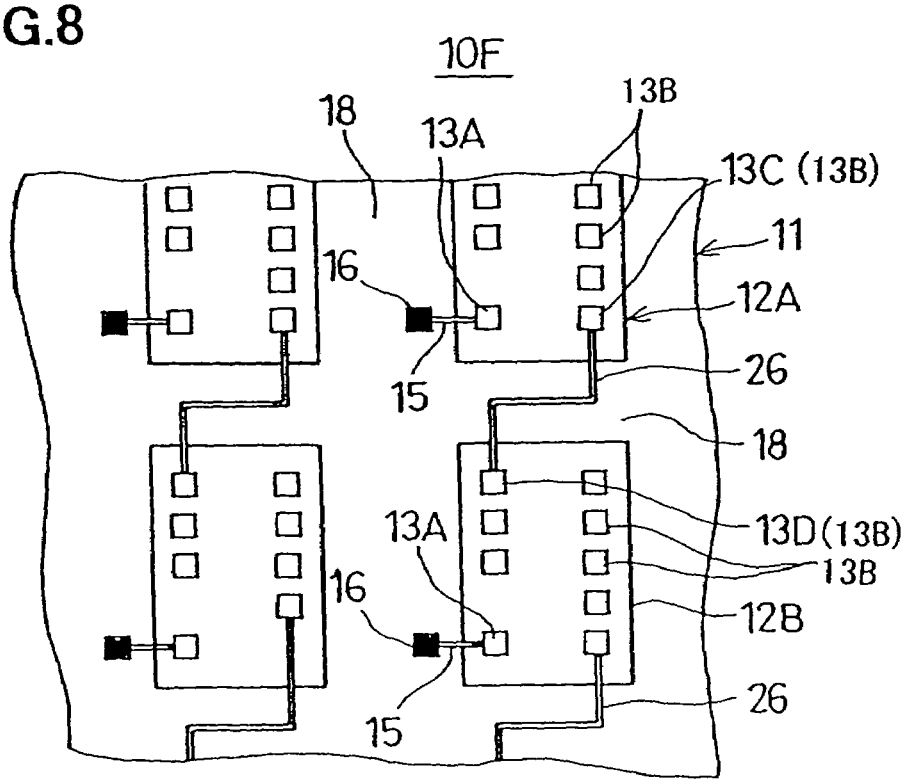
FIG. 8 is a diagram showing a connection state of a wafer-level package of a sixth embodiment of the present invention.

FIG. 8 is a diagram showing a connection state of a wafer-level package 10F of a sixth embodiment of the present invention. The wafer-level package 10F of the present embodiment is characterized in that the non-test chip terminals 13B of the plurality of the semiconductor chip circuits provided on the semiconductor wafer 11 are connected by joining lines 26. In detail, in the embodiment shown in FIG. 8, the chip terminal 13C provided in the circuit region 12A and the chip terminal 13D provided in the circuit region 12B are connected by the joining line 26.

Some of the non-test chip terminals 13B will be used to improve the test efficiency and reduce the number of interconnections, so that such non-test chip terminals 13B may remain connected during the test. Thus, by connecting such non-test chip terminals 13B (13C, 13D) by the joining line 26, it is possible to improve the test efficiency and reduce the number of interconnections.

Also, the joining lines 26 are provided in the outer region 18, and thus are removed when individualizing into semiconductor devices 40. Therefore, even if the joining lines 26 are provided on the wafer-level package 10F, the operating condition of the individualized semiconductor device 40 will not be altered.

In the following, a seventh embodiment of the present invention will be described.

Figure 9:
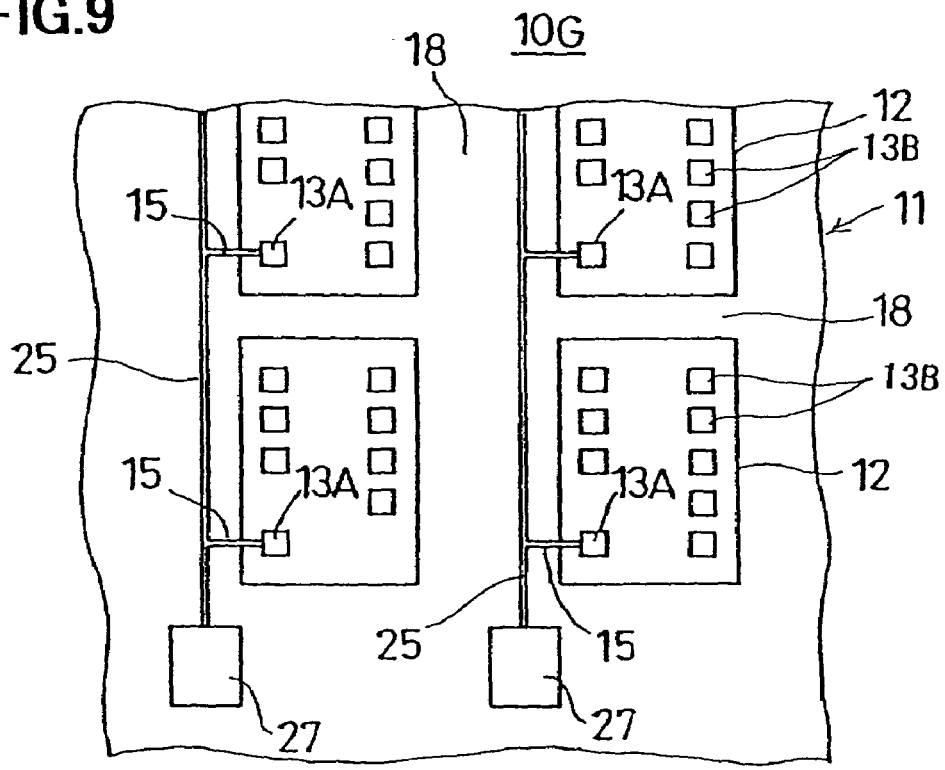
FIG. 9 is a diagram showing a connection state of a wafer-level package of a seventh embodiment of the present invention.

FIG. 9 is a diagram showing a connection state of a wafer-level package 10G of a seventh embodiment of the present invention. The wafer-level package 10G of the present embodiment is characterized in that the common lines 25 are provided in the outer region 18, and the redistribution traces 15 are connected to these common lines 25. Also, a test pad 27 is provided at a part of the common line 25. The test pad 27 is provided so as to be exposed from the insulating layer 17 (or sealing resin 22).

With the structure described above, the plurality of redistribution traces 15 corresponding to the plurality of circuit regions 12 are connected via the common lines 25. Thus, by supplying test signals to the test pads 27, the test signals can be simultaneously supplied to the plurality of semiconductor chip circuits via the common line 25. Therefore, a number of interconnections can be reduced. Also, since there is no need to provide the test terminal 16 for each of the semiconductor chip terminals, it is possible to simplify the structure and the manufacturing processes of the wafer-level package 10G.

In the following, an eighth embodiment of the present invention will be described.

Figure 10:
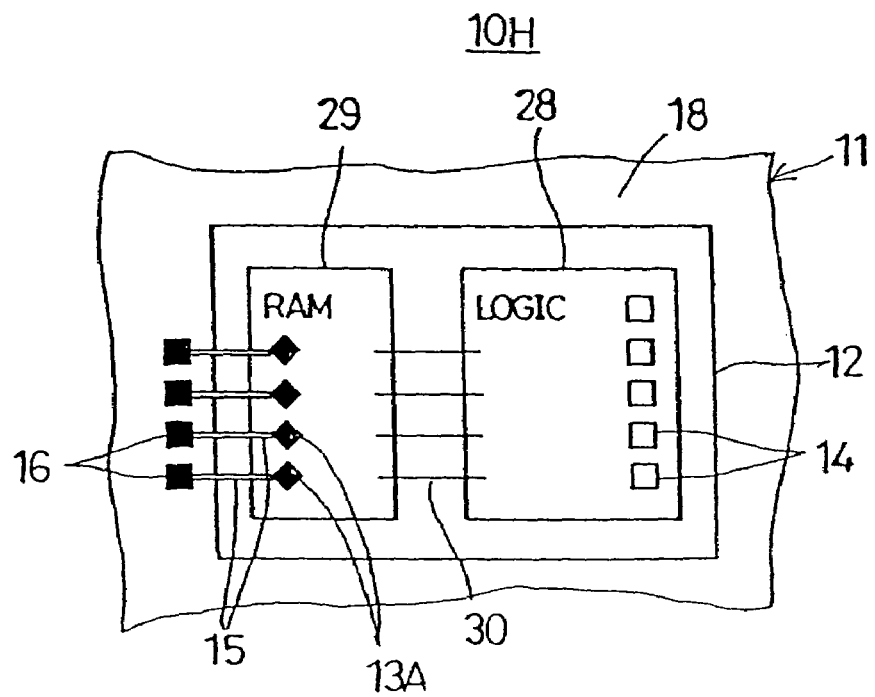
FIG. 10 is a diagram showing a connection state of a wafer-level package of an eighth embodiment of the present invention.

FIG. 10 is a diagram showing a connection state of a wafer-level package 10H of an eighth embodiment of the present invention. The wafer-level package 10H of the present embodiment is characterized in that a plurality of units 28, 29 having different functions are provided in the circuit region 12. Also, the redistribution traces 15 are extended out from each one or a combination of the plurality of units 28, 29 to the outer region 18. On the end positioned in the outer region 18, the redistribution trace 15 is provided with the test terminal 16.

In detail, in the present embodiment, the circuit region 12 is provided with a logic part (LOGIC) 28 and a random-access memory part (RAM) 29. The LOGIC 28 and the RAM 29 are connected by internal connections 30. Also, the LOGIC 28 is provided with chip terminals (not shown) having the external connection terminals 14 connected thereto. The semiconductor device having a mixed structure of units with different properties or functions, such as the RAM and the LOGIC, is referred to as a system LSI device. Recently, as a result of a higher density and higher performance of the semiconductor devices, more system LSI devices are used. However, it is difficult to individually test the units provided in the system LSI device.

This is because these units are interconnected by the internal connections 30 in the same circuit region 12 so that there may be a unit that cannot be directly accessed by the external connection terminals 14. For example, with the structure of the present embodiment, the LOGIC 28 and the RAM 29 are connected via the internal connections 30, and the external connection terminals 14 serve as access terminals to the LOGIC 28. Thus, the RAM 29 cannot be directly accessed via the external connection terminals 14.

Now, the function of the system LSI device will be described as a whole. The LOGIC 28 accesses the RAM 29 via the internal connections 30 so as to acquire and process data in the RAM 29. Then, the thus-obtained data is output from the external connection terminals 14. Therefore, with the system LSI of the structure of the related art, it is not possible to directly access the RAM 29. In other words, the RAM 29 cannot be tested individually in the related art.

However, with the structure of the present embodiment, it is now possible to test the RAM 29 individually. The redistribution traces 15 are pulled out to the outer region 18 from the RAM 29, and the test terminals 16 are provided on the redistribution trace 15. Thus, the RAM 29, which is a unit that is not directly connected to the external connection terminals 14, can be tested.

Accordingly, since it is now possible to test the RAM 29, the reliability of the test can be improved. Also, the redistribution traces 15 and the test terminals 16 will be removed when cutting the wafer-level package 10H into individualized semiconductor devices 40. Therefore, the operating condition of the individualized semiconductor device 40 will not be altered.

In the following, a ninth embodiment of the present invention will be described.

Figure 11:
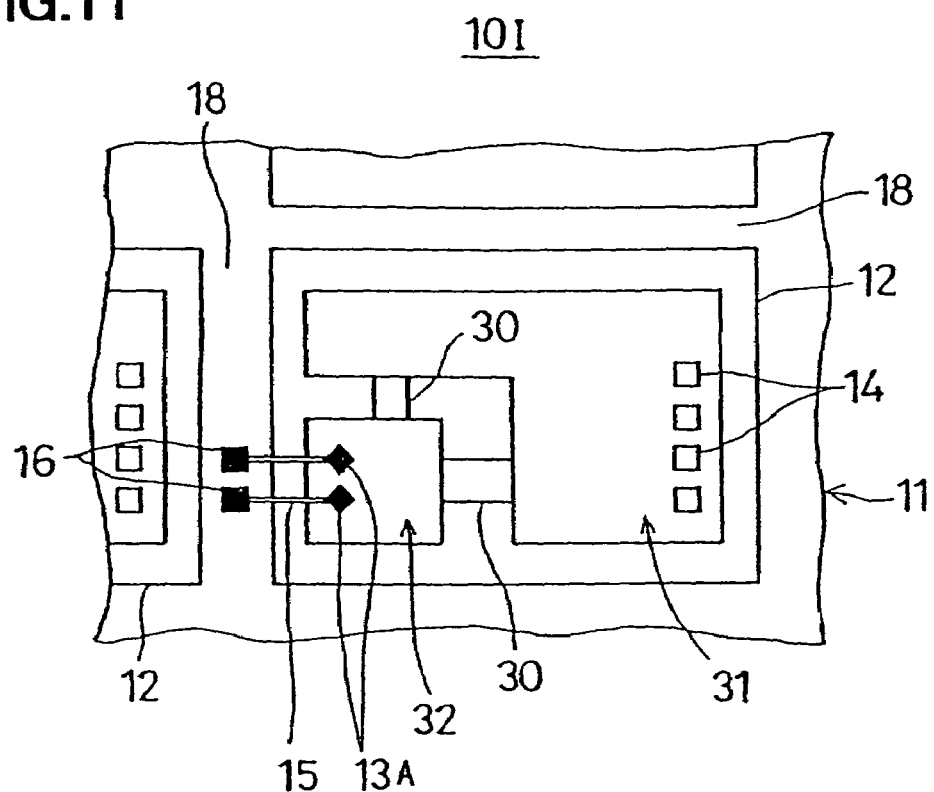
FIG. 11 is a diagram showing a connection state of a wafer-level package of a ninth embodiment of the present invention.

FIG. 11 is a diagram showing a connection state of a wafer-level package 10I of a ninth embodiment of the present invention. The wafer-level package 10I of the present embodiment includes a burn-in test circuit 32 (Built-In Self Test: BIST). The redistribution traces 15 are extended out from the BIST 32 to the outer region 18. The test terminals 16 are provided on the redistribution traces 15 in the outer region 18.

The BIST 32 implements the test on a main circuit part 31, so that it is possible to read out only the result of the test from the test chip terminals 13A. However, the test chip terminals 13A serving as input/output terminals of the BIST 32 are used only in the PT (or cannot not be used in the FT), since the test chip terminals 13A cannot be left as the external connection terminals after wafer packaging.

On the contrary, with the present embodiment, the test chip terminals 13A, serving as the input/output terminals of the BIST 32 after wafer packaging, can be accessed via the test terminals 16 and the redistribution traces 15. Thus, a test using the BIST 32 can be implemented in the FT. Thus, the PT will be not as necessary as it used to be, so that the test (full test) can be implemented only with the FT and without the PT.

In the following, a tenth embodiment of the present invention will be described.

Figure 12:
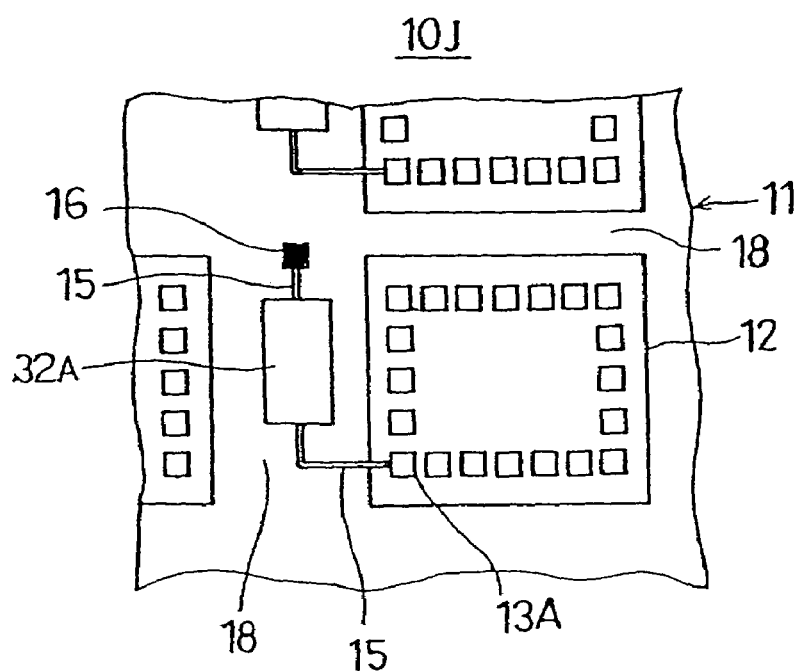
FIG. 12 is a diagram showing a connection state of a wafer-level package of a tenth embodiment of the present invention.

FIG. 12 is a diagram showing a connection state of a wafer-level package 10J of a tenth embodiment of the present invention. The wafer-level package 10J of the present embodiment is characterized in that a circuit exclusively used for a burn-in test 32A (hereinafter referred to as a BI circuit 32A) is provided in the outer region 18.

In detail, the redistribution trace 15 is provided from the test chip terminal 13A in the circuit region 12 to the outer region 18. The redistribution trace 15 is connected to the BI circuit 32A. As has been described above, the BI circuit 32A and the redistribution trace 15 are provided in the outer region 18. Also, the test terminal 16 may be provided directly on the BI circuit 32A.

Now, a full test on the wafer-level package and the normal wafer (here, the wafer-level package and the normal wafer will be referred to as a wafer) will be described. In the related art, the full test on the wafer was not often implemented before individualizing the wafer into the semiconductor devices. One of the reasons is that it is difficult to implement a burn-in test on the uncut semiconductor wafer. In other words, with the currently available contactor, it is difficult to contact all of the plurality of terminals (external connection terminals 14 and the test terminals 16) provided on each of the semiconductor chip terminals provided on the wafer. This is also because there are several tens of thousands of terminals provided on the wafer and thus the terminal pitch is narrow.

In order to minimize such a problem, an attempt has been made to incorporate the BI circuit 32A into the circuit region 12, and then contacting a few terminals (burn-in terminals accessing the burn-in circuit). However, with the wafer-level package of the related art in which the BI circuit 32A is incorporated within the circuit region 12, the burn-in terminals will, together with the external connection terminals 14, remain in the semiconductor device 40, thus producing the same problem as above.

However, with the structure of the present embodiment, the redistribution traces 15 are pulled out from the BI circuit 32A to the outer region 18. The test terminals 16 serving as the burn-in terminals are provided on the redistribution traces 15 in the outer region 18, so that it is possible to access the BI circuit 32A via the test terminals 16. Thus, the BI circuit 32A can be used after providing the insulating layer 17 (sealing resin 22).

Accordingly, it is possible to implement a burn-in test on the wafer-level package 10I, so that a test with an increased reliability is possible. Also, since the test terminals 16 will be removed when individualizing into the semiconductor devices 40, the operating condition of the individualized semiconductor device 40 will not be altered.

In the following, an eleventh embodiment of the present invention will be described.

Figure 13:
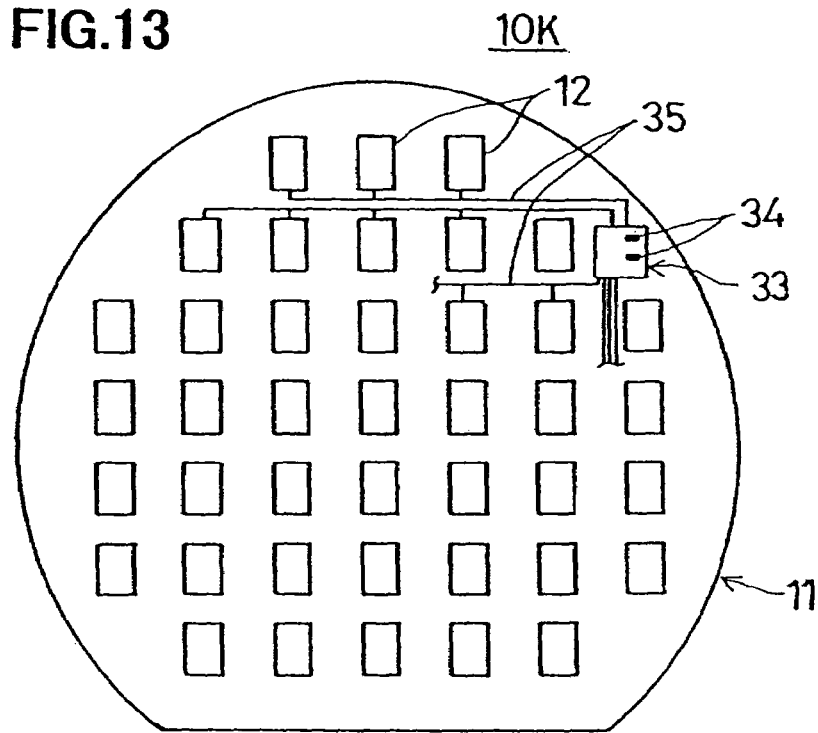
FIG. 13 is a plan view showing a wafer-level package of an eleventh embodiment of the present invention.

FIG. 13 is a plan view showing a wafer-level package 10K of an eleventh embodiment of the present invention. The wafer-level package 10K of the present embodiment is characterized in that a test history recording part 33 (test history storage) is provided in the outer region 18 on the semiconductor wafer 11.

The test history recording part 33 is connected to all semiconductor chip circuits on the semiconductor wafer 11 via redistribution traces 35 exclusively used for recording provided in the outer region 18. Also, the test history recording part 33 is provided with access terminals 34 (input/output terminals).

The access terminals 34 protrude upwards from the insulating layer 17 (sealing resin 22) formed on the semiconductor wafer 11, so that is possible to access the test history recording part 33 after providing the insulating layer 17 (sealing resin 22). By accessing the test history recording part 33, it is possible to store/retrieve the test data such as test history and the positions of the bad semiconductor chip circuits.

With the wafer-level package 10K provided with the insulating layer 17 or the sealing resin 22, the whole semiconductor wafer 11 is covered with the resin (in many cases a black resin). Thus, it is difficult to implement a visual inspection. Also, since the semiconductor chip circuits are provided on the semiconductor wafer 11 with a high density, it is difficult to imprint characters or codes indicating a vast amount of test history information on the peripheral part of the wafer-level package 10K.

However, with the test history recording part 33, a vast amount of test history information of the wafer-level package 10K can be easily written in/read out. Thus, efficiency and accuracy of the test can be improved. Also, since the test history recording part 33 is provided on the outer region 18, it will be removed when individualizing into the semiconductor devices 40. Thus, the operating condition of the individualized semiconductor device 40 will not be altered.

In the following, a twelfth embodiment of the present invention will be described.

Figure 14:
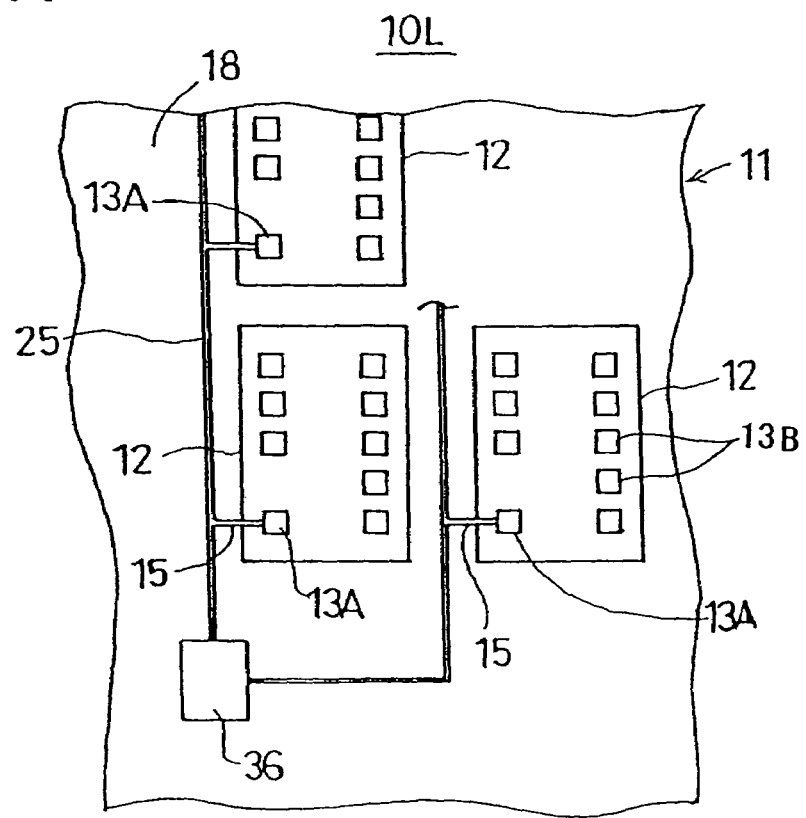
FIG. 14 is a diagram showing a connection state of a wafer-level package of a twelfth embodiment of the present invention.

FIG. 14 is a diagram showing a connection state of a wafer-level package 10L of a twelfth embodiment of the present invention. The wafer-level package 10L of the present embodiment is provided with a test support element 36 for testing the semiconductor chip circuit on the outer region 18 on the semiconductor wafer 11. Also, the redistribution traces 15 connected to the test chip elements 13A provided in the circuit region 12 are connected to the test support element 36 via the common line 25.

The test support element 36 may be an electronic element such as a test LSI circuit or a resistance. With the test support element 36, the efficiency of the wafer-level test can be improved. Also, it is advantageous when implementing a high-frequency test, since the distance between the test chip terminal 13A and the test support element 36 can be shortened.

Also, since the test support element 36 and the common line 25 are provided in the outer region 18, they will be removed when individualizing into the semiconductor devices 40. Thus, the operating condition of the individualized semiconductor device 40 will not be altered.

In the following, a thirteenth embodiment of the present invention will be described.

Figure 15:
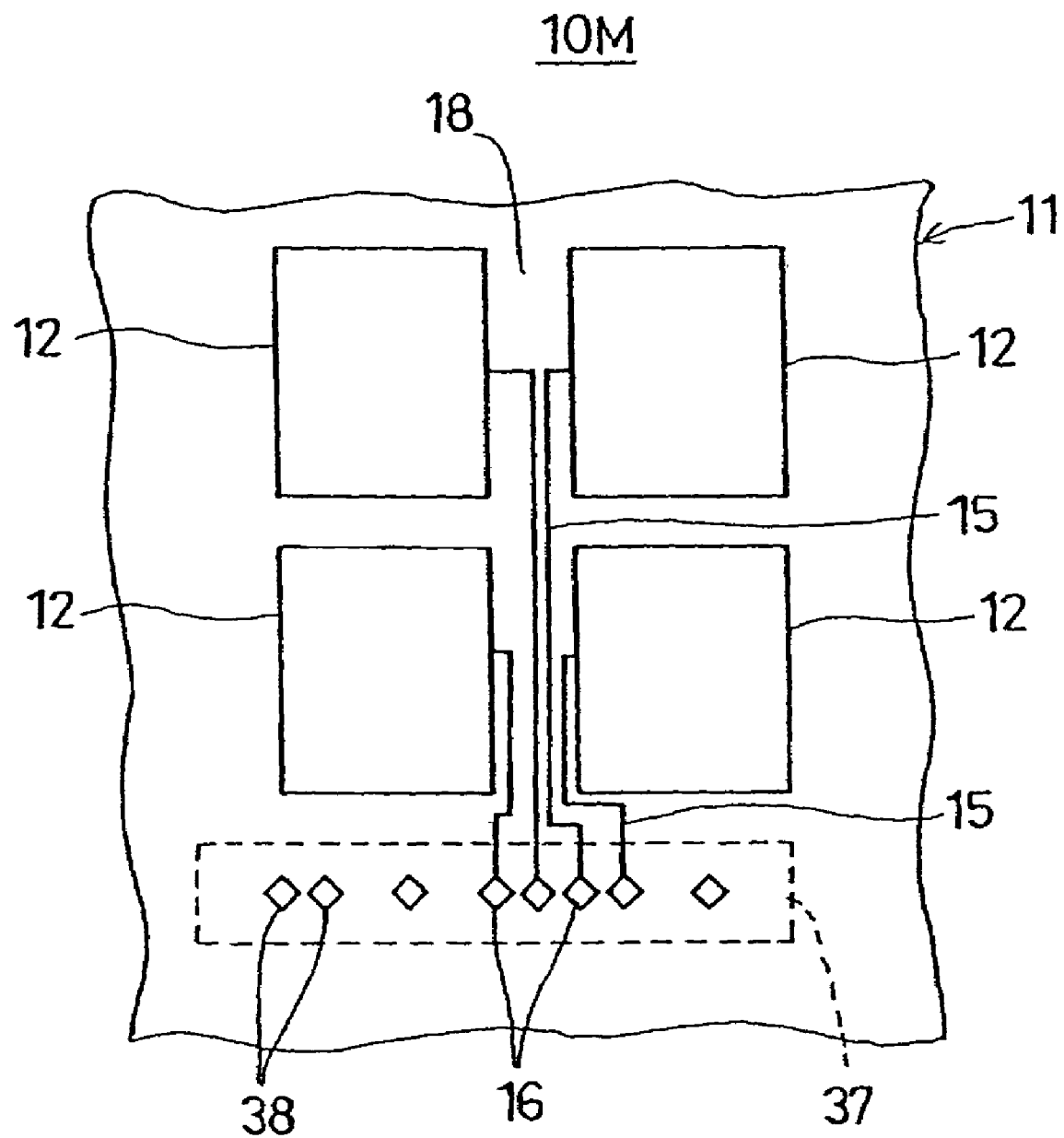
FIG. 15 is a diagram showing a connection state of a wafer-level package of a thirteenth embodiment of the present invention.

FIG. 15 is a diagram showing a connection state of a wafer-level package 10M of a thirteenth embodiment of the present invention. The wafer-level package 10M of the present embodiment is characterized in that the test terminals 16 and dummy terminals 38 are provided in an identification area 37 with a predetermined rule, thus enabling identification.

The identification area 37 is provided in the outer region 18 of the semiconductor wafer 11, and the test terminals 16 are connected to the corresponding circuit region 12 by means of the redistribution traces 15. Also, the dummy terminal 38 is not connected to the redistribution trace 15, but has the same shape as that of the test terminal 16 and is exposed from the insulating layer 17 (sealing resin 22).

As has been described above, it is difficult to visually inspect the wafer-level package 10K provided with the insulating layer 17 or the sealing resin 22. However, the test terminals 16 and the dummy terminals 38 are arrange with a predetermined rule indicating the characteristics (e.g., index mark, type code, lot identification) of the semiconductor wafer 11 and are exposed from the insulating layer 17 (sealing resin 22). Therefore, the semiconductor wafer 11 can be identified by viewing the positions of the test terminals 16 and the dummy terminals 38, so that the identification process can be implemented on the wafer-level package 10M, which is not particularly suitable for visual inspection.

Further, the test terminals 16 and the dummy terminals 38 having the identification function are also removed when individualizing into the semiconductor devices 40. Therefore, the operating condition of the individualized semiconductor device 40 will not be altered. Also, if the identification is possible by viewing the positioning of the test terminals 16, it is not always necessary to provide the dummy terminals 38.

In the following, a fourteenth embodiment of the present invention will be described.

Figure 20:
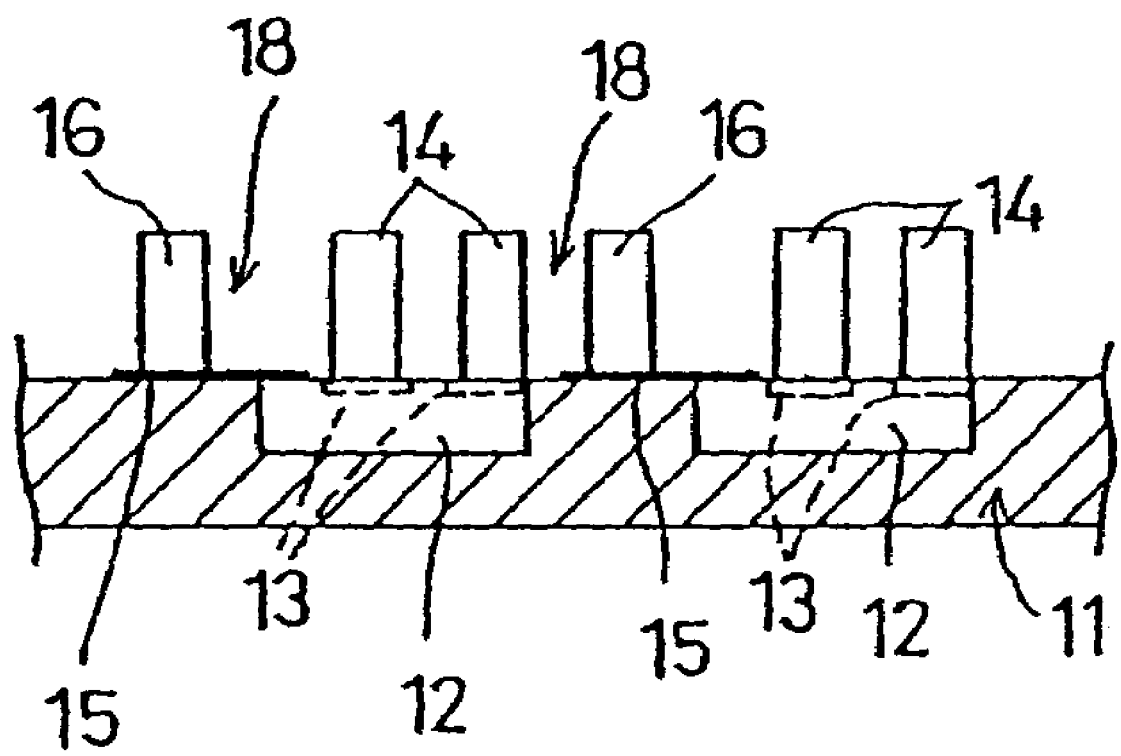
FIG. 20 is a partial sectional view showing a wafer-level package of a fourteenth embodiment of the present invention.

FIG. 20 is a cross-sectional view showing a wafer-level package 10N of a fourteenth embodiment of the present invention. In wafer-level packages 10A to 10M, there is provided the insulating layer 17 or the sealing resin 22 on the redistribution trace 15, whereas the wafer-level package 10N is not provided with the insulating material (insulating layer 17, sealing resin 22, etc.) Note that an insulating film is provided between the semiconductor chip circuit and the redistribution traces 15.

With the above-described structure, the redistribution traces 15 are always exposed outside, so that the test terminals 16 can be formed on the redistribution traces 15 exposed from the circuit 12. Thus, each of the semiconductor chip circuits can be tested after the wafer-level package 10N has been manufactured.

However, as has been described, it is preferable that that terminals not used by the users are not provided in the circuit region 12. Thus, instead of the test terminals 16, flat connection pads capable of being connected to test contacts 41 can be provided in the circuit region 12 (see FIG. 18). However, in order to achieve a proper connection with the test contact, the connection pad must have a certain area. Then, with this structure, the area of the circuit region 12 will become too large.

On the contrary, with the wafer-level package 10N of the present embodiment, the chip terminal 13 used during the test is extended out to the position outside the circuit region 12 by means of the redistribution trace 15, while providing the test terminal 16 on the redistribution traces 15 thus extended out. Therefore, the circuit region 12 will not become too large even if the test terminals 16 are provided. Therefore, compared to the structure where the test terminals are provided in the circuit region 12, the circuit region 12 can be used efficiently, and thus when individualized, each of the semiconductor device 40 will become compact.

Also, the test terminals 16 are provided at positions to be removed upon individualizing into semiconductor devices 40, so that the test terminals 16 will not remain on the individualized semiconductor devices 40. Therefore, even if the test terminals 16 are provided on the wafer-level package 10N, the operating condition of the individualized semiconductor device 40 will not be altered.

In the following, a method of manufacturing the semiconductor device (hereinafter referred to as a semiconductor device manufacturing method) using the wafer-level package of an embodiment of the present invention will be described.

Figure 16:
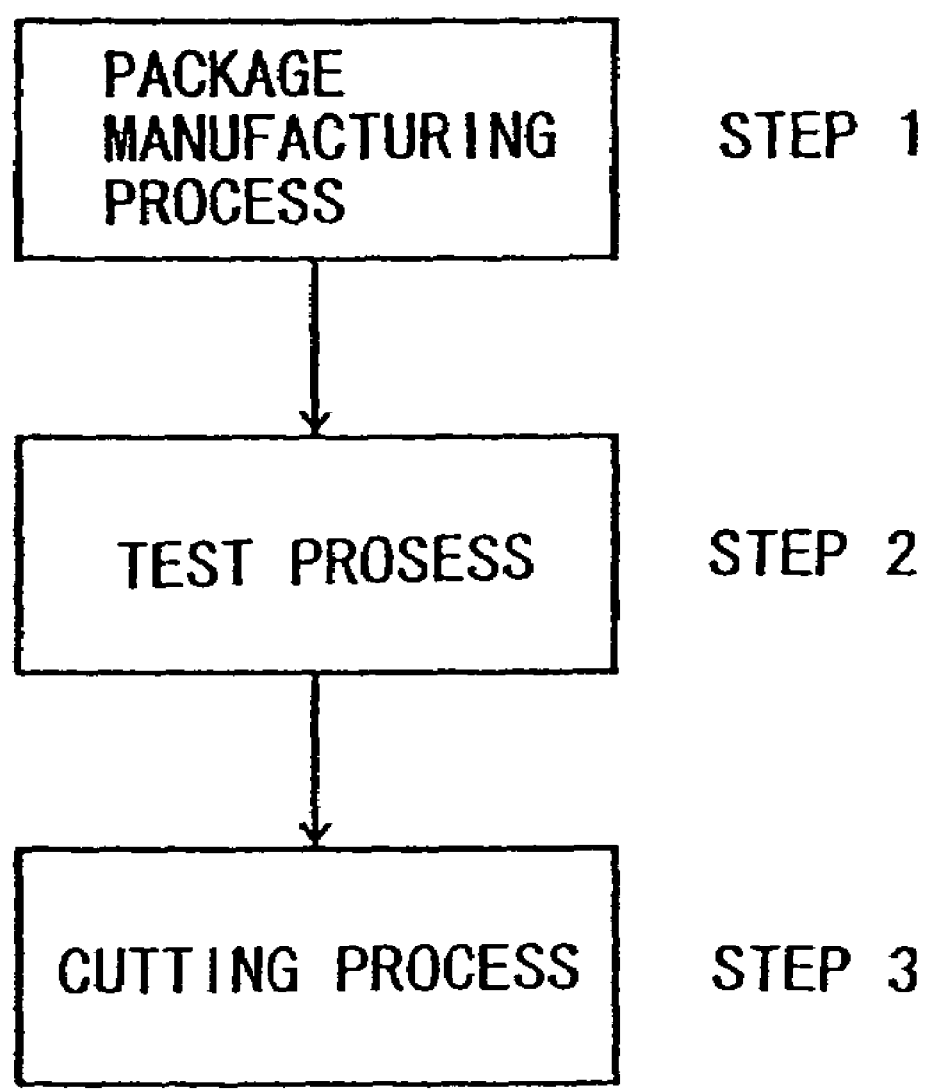
FIG. 16 is a flowchart showing a method of manufacturing a semiconductor device using a wafer-level package of one embodiment of the present invention.

The semiconductor device manufacturing method will be described with reference to FIGS. 16 to 19. FIG. 16 is a flowchart showing the semiconductor device manufacturing method and FIGS. 17A to 19 are detailed diagrams showing the semiconductor device manufacturing method.

As shown in FIG. 16, the semiconductor device manufacturing method of the present embodiment includes a package manufacturing process (step 1), a test process (step 2) and a cutting process (step 3).

In the package manufacturing process (step 1), the wafer-level package 10B of the second embodiment shown in FIG. 4 is manufactured. In the test process (step 2), the semiconductor chip circuits provided on the wafer-level package 10B are tested by means of the test terminals 16 and the external connection terminals 14. In the cutting process (step 3), the outer region 18 (scribe regions) of the wafer-level package 10B is cut so as to manufacture the individualized semiconductor devices 40. In the following, each of the processes will be described in detail.

Figure 17A:
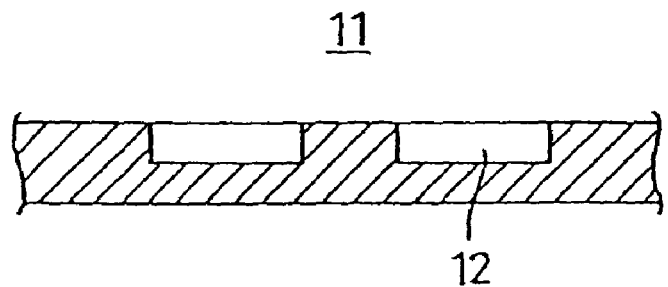
FIGS. 17A to 17D are cross-sectional diagrams showing a package manufacture process of the method of manufacturing a semiconductor device using a wafer-level package of one embodiment of the present invention.

FIGS. 17A to 17D are diagrams showing the package manufacturing process (step 1) for manufacturing the wafer-level package 10B. In order to manufacture the wafer-level package 10B, first, as shown in FIG. 17A, the semiconductor wafer 11 provided with the circuit regions 12 is prepared.

Figure 17B:
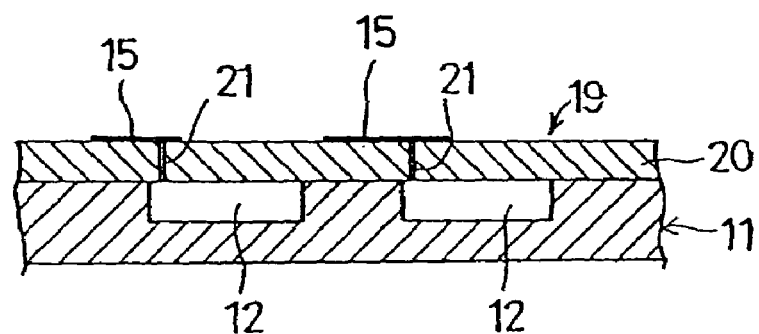

Then, as shown in FIG. 17B, the insulating film 20 (SiO$_2$ film) having a predetermined thickness is provided on the semiconductor wafer 11. Also, using a photolithography technique, small holes are formed in the insulating film 20. Then, an electrically conductive film is formed on the insulating film 20 by plating (or by other thin-film forming techniques such as sputtering and deposition). Further, the redistribution traces 15 having a predetermined pattern are formed by etching.

When providing the electrically conductive material, some of the electrically conductive material will be introduced into the above-described small holes, so that the through holes 21 are formed. Also, the lower ends of the through holes 21 are electrically connected to the chip terminals 13 (13A) provided in the circuit region, and the upper ends are electrically connected to the redistribution traces 15. Thus, the redistribution layer 19 is formed on the semiconductor wafer 11.

Figure 17C:
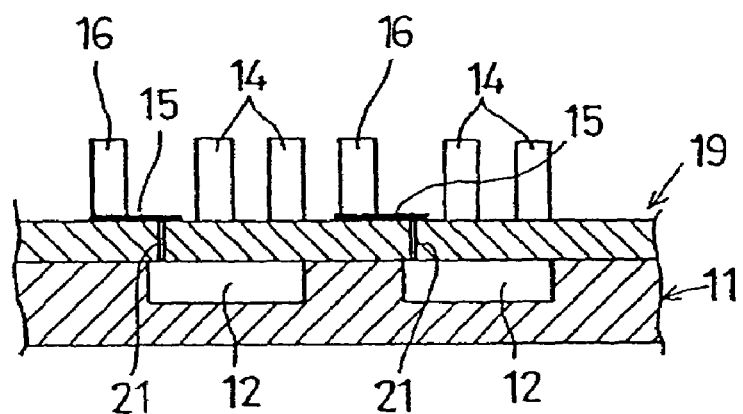

Then, after providing the redistribution layer 19 as described above, the external connection terminals 14 and the test terminals 16 are formed as shown in FIG. 17C. As has been described above, the external connection terminals 14 and the test terminals 16 may be formed simultaneously, because their shapes are identical. Therefore, the present embodiment is described regarding to a case in which the external connection terminals 14 and the test terminals 16 are formed simultaneously.

In detail, a mask having openings at positions corresponding to the external connection terminals 14 and the test terminals 16 is used, and the external connection terminals 14 and the test terminals 16 are grown by plating (or sputtering or deposition). The heights of the terminals 14, 16 may be adjusted by controlling the plating time. Thus, in the present embodiment, since the external connection terminals 14 and the test terminals 16 are formed simultaneously, the manufacturing process can be simplified compared to a structure in which the terminals 14, 16 are formed in separate steps.

In the present embodiment, the external connection terminals 14 are formed directly on the chip terminals 13B provided on the semiconductor chip circuit, and the test-terminals 16 are formed on the redistribution traces 15. Also, the test terminals 16 are formed at the position outside the circuit area 12, i.e., in the outer region 18.

Figure 17D:
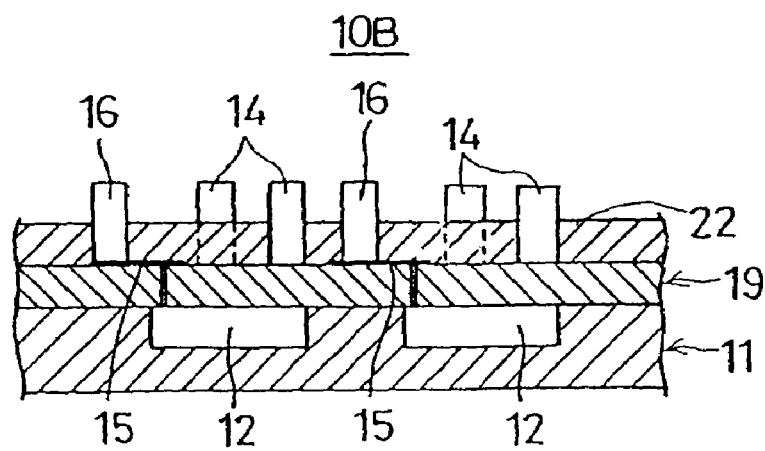

After the external connection terminals 14 and the test terminals 16 are formed in the manner described above, the semiconductor wafer 11 is mounted on the mold (not shown) and the resin mold process is implemented. Thus, as shown in FIG. 17D, the sealing resin 22 is formed on the semiconductor wafer 11. As has been described above, the sealing resin 22 may be made of an epoxy-type resin.

When forming the sealing resin 22, a molding process is implemented so that the predetermined top part of the external connection terminals 14 and the test terminals 16 are exposed from the sealing resin 22. Therefore, even after the sealing resin 22 (insulating material) has been provided, the semiconductor chip circuit is accessible via the external connection terminals 14 and the test terminals 16.

Thus, by implementing the above-described processes, the wafer-level package 10B is manufactured.

Figure 18:
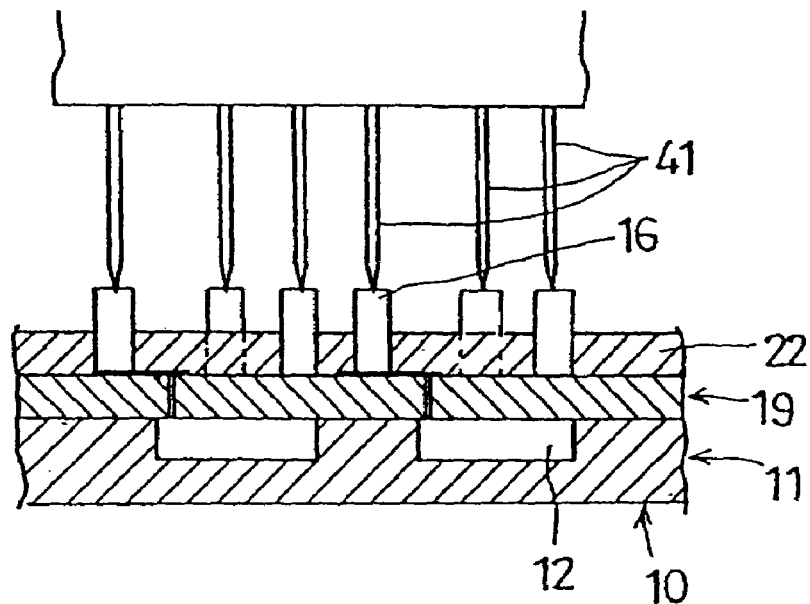
FIG. 18 is a cross-sectional diagram showing a test process of the method of manufacturing a semiconductor device using a wafer-level package of one embodiment of the present invention.

The package manufacturing process (step 1) is followed by the test process (step 2). FIG. 18 is a diagram showing the test process.

In the test process, test contactors 41 connected to a semiconductor device tester (not shown) are brought into contact with the external connection terminals 14 and the test terminals 16 exposed from the sealing resin 22. Then, the PT and the FT, which are carried out in separate steps in the related art, are implemented simultaneously.

That is to say, in the present embodiment, the test terminals 16 connected to the test chip terminals 13A can be used after the sealing resin 22 (insulating material) has been provided. Therefore, the test can be implemented using both the external connection terminals 14 and the test terminals 16. Thus, the PT, which is implemented before providing the sealing resin 22 in the related art, and the FT, which is implemented after providing the sealing resin 22 (i.e., a full test), can be implemented simultaneously. Accordingly, the test process can be simplified. Also, the external connection terminals 14 can be provided with a greater pitch than that for the PT implemented on the wafer. Therefore, it is possible to reduce an accuracy of the contactors connected to the external connection terminals 14 during the test. Thus, it is easier to make contact.

In the embodiment shown in FIG. 18, the contactors connected to the external connection terminals 14 and the test terminals 16 are shown as probe-type contactors, but contactors of a membrane type may be used.

When the test history recording part 33 is provided as in the wafer-level package 10K of the eleventh embodiment, shown in FIG. 13, the information obtained from the above-described test is stored in the test history recording part 33.

Further, when the wafer-level package 10B is used as an uncut semiconductor wafer, the cutting process (step 3) described later is omitted and the wafer-level package 10B is mounted on the mounting board.

Figure 19:
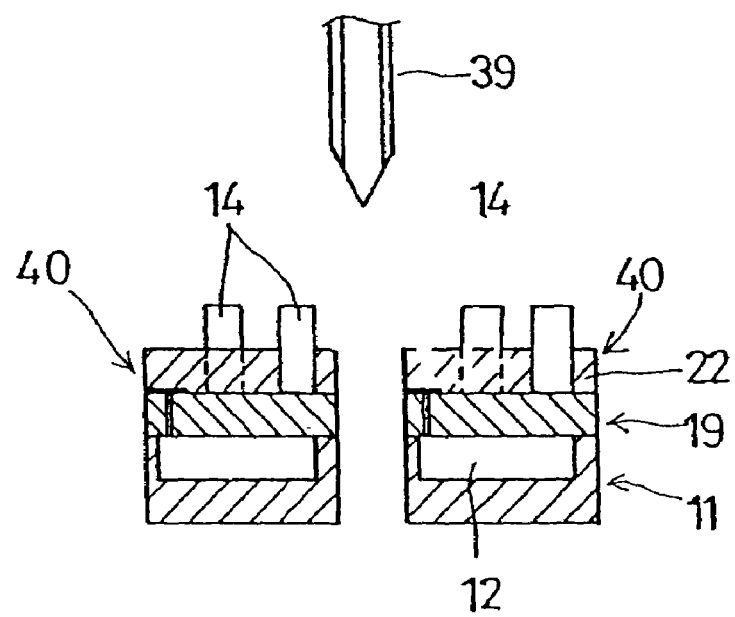
FIG. 19 is a cross-sectional diagram showing a cutting process of the method of manufacturing a semiconductor device using a wafer-level package of one embodiment of the present invention.

The above-described package manufacturing process (step 1) and a test process (step 2) are followed by the cutting process (step 3). As shown in FIG. 19, in the cutting process, the outer region 18 is cut and removed by means of a dicing saw 39. Thus, individualized semiconductor devices 40 are formed.

The cutting positions (dicing lines) of the dicing saw 39 are at the outer region 18 as shown by the dash-dot line shown in FIG. 3. Also, after the cutting process by the dicing saw 39, the size of the semiconductor device 40 viewed from above will be approximately equal to the size of the circuit region 12. That is to say, the semiconductor device 40 thus manufactured is a real-chip-size package.

Since the dicing saw 39 will cut along cutting regions in the outer region 18 and the components (in the present embodiment, the redistribution traces 15, the test terminals 16) provided in the outer region 18 are removed during the cutting process. According to the structure of the present embodiment, the manufacturing process can be simplified compared to the structure in which separate processes for removing the components 15, 16 are provided.

Also, since the redistribution traces 15 and the test terminals 16 will not remain on the individualized semiconductor devices 40, the semiconductor device 40 can be reduced in size. The presence of the redistribution traces 15 and the test terminals 16 will not alter the operating condition of the individualized semiconductor device 40.

The manufacturing method of the present embodiment has been described for the wafer-level package 10B. However, the wafer-level packages 10A, 10C to 10M of the first and third to thirteenth embodiments can also be manufactured using generally the same manufacturing method and the same effects can be achieved.

Also, with the wafer-level packages 10A, 10C to 10M of each embodiment, the components provided on the outer region 18 will be removed in the cutting process. Therefore, the presence of such components will not alter the operating condition of the individualized semiconductor device 40.

Further, the present invention is not limited to these embodiments, but variations and modifications may be made without departing from the scope of the present invention.

The present application is based on Japanese priority application No. 10-374804 filed on Dec. 28, 1998, the entire contents of which are hereby incorporated by reference.

The invention claimed is:

1. A wafer-level package comprising:
   a semiconductor wafer having at least one semiconductor chip circuit forming region each including a semiconductor chip circuit and a plurality of chip terminals, said chip terminals including at least one test chip terminal and at least one non-test chip terminal;
   at least one external connection terminal electrically connected to said at least one non-test chip terminal;
   at least one redistribution trace provided on said semiconductor wafer, a first end of said redistribution trace being connected to one of said test chip terminals and a second end of said redistribution trace being extended out to a position offset from said one of said chip terminals;
   at least one testing member provided in an outer region of said semiconductor chip circuit forming region, said second end of said redistribution trace being connected to said at least one testing member;
   an insulating material covering at least said redistribution trace, said at least one external connection terminal and said at least one testing member being exposed from said insulating material;
   a test history recording part provided in said outer region and connected to said second end of a plurality of said redistribution traces; and
   input/output terminals for writing into/reading out from said test history recording part, said input/output terminals being exposed from said insulating material.

* * * * *